United States Patent [19]

Nishikawa

[11] Patent Number: 5,654,585
[45] Date of Patent: Aug. 5, 1997

[54] SEMICONDUCTOR DEVICE WITH AT LEAST ONE LEAD HAVING A PLURALITY OF BENT PORTIONS

[75] Inventor: Hideyuki Nishikawa, Tokyo, Japan

[73] Assignee: NEC Corporation, Japan

[21] Appl. No.: 531,121

[22] Filed: Sep. 20, 1995

[30] Foreign Application Priority Data

Sep. 30, 1994 [JP] Japan .................. 6-236542

[51] Int. Cl.$^6$ .................................................. H01L 23/495
[52] U.S. Cl. ........................................ 257/666; 257/692
[58] Field of Search ............................. 257/666, 676, 257/692, 690

[56] References Cited

U.S. PATENT DOCUMENTS 5,455,446  10/1995  Suppelsa et al. ................ 257/666

FOREIGN PATENT DOCUMENTS 6381967  4/1988  Japan .
1187843  7/1989  Japan .
6-163776  6/1994  Japan ........................ 257/666

Primary Examiner—Tom Thomas
Assistant Examiner—Roy Potter
Attorney, Agent, or Firm—Hayes, Soloway, Hennesssey, Grossman & Hage, P.C.

[57] ABSTRACT

There is provided a semiconductor device and a lead frame in which the cross section of bent portions (5a, 5b) of a gull wing type external lead (3) having a plurality of bent portions (5a, 5b) is arranged so that the width of bended inside is formed wider than that of the outside. By forming the external lead (3) in this manner, the external lead (3) of the lead frame is stably formed, and when the semiconductor device is mounted on a printed circuit board (9), a solder fillet is sufficiently formed about the bent portion (5b), and the connecting reliability can be made increased.

11 Claims, 7 Drawing Sheets

SEMICONDUCTOR DEVICE WITH AT LEAST ONE LEAD HAVING A PLURALITY OF BENT PORTIONS

FIELD OF THE INVENTION

The present invention relates to a semiconductor device and a lead frame and, in particular, to a semiconductor device and a lead frame each provided with a lead having a plurality of bent portions.

BACKGROUND OF THE INVENTION

Conventionally, lead frames have been used to manufacture a semiconductor device, and the lead frames are generally manufactured by photoetching or pressing a thin metallic plate into a predetermined form. After a semiconductor integrated circuit chip is loaded on a resulting lead frame and the semiconductor chip and an internal lead of the lead frame are interconnected by means of a thin metallic wire, they are sealed with resin or the like and an external lead is formed into a predetermined form to complete a semiconductor device.

When the lead frame is manufactured by photoetching, it is typical to design it so that the widths of the upper and lower surfaces of the external lead, i.e. lengths of the upper and lower sides in cross section of the external lead, are equal. However, when photoetching is conducted by setting the widths of the upper and lower surfaces of the external lead equal, if misalignment occurs between upper surface and lower surface photomasks, then the external lead is made inclined at subsequent external lead formation, making it difficult to mount the semiconductor device on a printed circuit board.

The thinner the external lead is made, the more exacerbated such phenomenon becomes, and in order to help prevent this, as shown in Japanese Patent Application Laid-Open No. 63-81967, there is a technique in which the widths of the upper and lower surfaces of the external lead are set different from each other and photoetching is conducted.

The technique disclosed in Japanese Patent Application Laid-Open No. 63-81967 is described with reference to the drawings. Conventionally, as shown in FIG. 1B, the width X of the upper surface and the width Y of the lower surface are set equal in the cross section of the external lead 3 and, as shown in FIG. 1A, an upper surface photomask 1 and a lower surface photomask 2 have been overlaid on the upper and lower surfaces of a lead frame material 10 to conduct the photoetching. At this time, if there is no misalignment between the upper surface photomask 1 and the lower surface photomask 2, an external lead 3 having a rectangular cross section as shown in FIG. 1B is obtained, and even if the external lead 3 is formed so as to be bent, it is not inclined. However, as shown in FIG. 2A, if misalignment occurs between the upper and lower surface photomasks 1 and 2, an external lead 3 having a cross section of parallelogram form, as shown in FIG. 2B, is obtained, and if the semiconductor device is manufactured using such a lead frame, when the external lead 3 is formed to be bent, the bending moment becomes great in the transverse direction, and as shown in FIG. 3, the external lead 3 is made inclined relative to the predetermined direction and it becomes difficult to mount the semiconductor device on the printed circuit board.

As the measure against this, as shown in FIG. 4B, the widths X and Y of the upper and lower surfaces of the external lead 3 are set different to conduct photoetching. Concretely, as shown in FIG. 4A, during patterning by photoetching, the lower surface photomask 2 for the lead frame material 10 is made wider than the upper surface photomask 1. By so doing, as shown in FIG. 4B, an external lead 3 having a trapezoidal cross section is obtained. If the semiconductor device is manufactured by using a lead frame having the external lead 3 the cross section of which is trapezoidal, then, as compared with the case of the above-mentioned conventional lead frame having the external lead of parallelogram cross section, as shown in FIG. 2B, the bending moment becomes small in the transverse direction when the external lead 3 is formed so as to be bent, and obliqueness of the external lead as shown in FIG. 3 can be prevented. Further, even if, as shown in FIG. 5A, during photoetching, the misalignment between the upper surface and lower surface photomasks 1 and 2 occurs, as shown in FIG. 5B, an external lead 3 having a trapezoidal cross section is obtained, and as compared with the conventional one having a parallelogram cross section, the bending moment becomes small in the transverse direction when the external lead 3 is formed to be bent, and the inclination of the external lead is reduced.

Although Japanese Patent Application Laid-Open No. 63-81967 was heretofore described, according to Japanese Patent Application Laid-Open No. 1-187843, which was disclosed thereafter, the following problems are pointed out. That is, in a semiconductor device having a gull wing type external lead, since the bent portion is formed by bending the external lead to both upper and lower sides thereof, if the cross-sectional forms of each bent portion of the external lead are formed with the same trapezoidal forms, a bent portion whose inside becomes narrower than the outside and another bent portion whose inside becomes wider than the outside result. At the bent portion whose inside becomes wider, stress is concentrated at the inside thereof during bending, and the external lead becomes easy to be cut during the forming process and to be deformed or damaged when the device is selected or carried. Therefore, with reference to FIGS. 6A to 6C, the cross-sectional form of a bent portion 5a of a gull wing type external lead 3 is formed into a trapezoidal form whose lower bottom is shorter than the upper bottom, as shown in FIG. 6B, while the cross-sectional form of the other bent portion 5b is formed into a trapezoidal form whose lower bottom is longer than the upper bottom, as shown in FIG. 6C. Since the bent portions 5a, 5b are thus formed into a trapezoidal cross-section whose upper and lower sides are reversed, the widths of the inside of the bent portions 5a, 5b are formed narrower than those of the outside of the bent portions 5a, 5b.

In the Japanese Patent Application Laid-Open No. 1-187843, it is pointed out that the bent portion in which the inside of the external lead is wider is not preferable because the stress is concentrated to the inside thereof when bending, and as a technique for solving this problem, the width of the inside in the bent portion of the outer lead is arranged so as to become narrower than that of the outside.

Actually, however, there is practically no problem of stress concentration at the bent portion whose inside is wider, and surprisingly, the following problem occurs by making the width of the inside of the external lead bent portion narrower than that of the outside.

(1) As shown in FIG. 12B, if the fulcrum 6 of the bending is present at the narrower side of the external lead 3, since the length which contacts the fulcrum 6 is relatively smaller compared with the case in which the fulcrum 6 is present at the wider side of the external lead 3 as shown in FIG. 12A, the forming of the external lead becomes unstable. In particular, if any misalignment occurs between the upper and lower surface photomasks when the lead frame is manufactured, formation of the external lead becomes more unstable and the external lead is deformed greatly.

(2) As shown in FIG. 6C, since the cross-sectional form of the bent portion 5b shown in FIG. 6A is formed trapezoidal so that the lower bottom is longer than the upper bottom, when the semiconductor device is mounted on the printed circuit board, formation of the solder fillet in the neighborhood of the bent portion 5b becomes insufficient. Since formation of the solder fillet at this portion exerts an extremely great effect on the strength with which the external lead is interconnected to the printed circuit board, the strength is greatly reduced.

SUMMARY OF THE INVENTION

Accordingly, an object of the present invention is to provide a semiconductor device and a lead frame used therein which allow a stable lead forming or bending process and realize an improved reliability in connecting the external lead to a printed circuit board.

According to the present invention, there is provided a semiconductor device provided with a lead having a plurality of bent portions, wherein the width of an inside of each bent portion is made wider than that of an outside.

In the present invention, the lead may comprise an external lead or a suspension lead. An end portion positioned outwardly of an outermost one of the bent portions of the lead can be soldered to a printed circuit board, for example, so as to form a solder fillet between a surface of the printed circuit board and both lateral surfaces of the end portion making an acute angle with the surface of the printed circuit board.

According to the present invention, there is provided a semiconductor device comprising:
- a plurality of leads, the leads each having a first principal surface and a second principal surface, the leads each having an external lead portion and an internal lead portion each comprising the first principal surface and the second principal surface;
- a semiconductor chip; and
- a package for enfolding the semiconductor chip and the internal lead portion, wherein the external lead portion has a first portion and a second portion, the second portion connecting the first portion to the internal lead portion and, in the first portion, a width of a side of the first principal surface is wider than that of a side of the second principal surface, while, in the second portion, a width of the side of the second principal surface is wider than that of the side of the first principal surface.

In the present invention, preferably, the first portion of the external lead portion has a first bent portion with an inside at the side of the first principal surface and the second portion of the external lead portion has a second bent portion with an inside at the side of the second principal surface. An end portion positioned externally of the first bent portion of the external lead portion can be soldered to a printed circuit board, for example, so as to form a solder fillet between a surface of the printed circuit board and both lateral surfaces of the end portion making an acute angle with the surface of the printed circuit board.

The semiconductor device may further comprise a die pad portion and a suspension lead, the suspension lead comprising the first principal surface and the second principal surface and being connected to the die pad portion to support it, wherein the suspension lead has a first portion and a second portion, the second portion of the suspension lead connecting the first portion of the suspension lead to the die pad portion and, in the first portion of the suspension lead, a width of the side of the second principal surface is wider than that of the side of the first principal surface, while, in the second portion of the suspension lead, a width of the side of the first principal surface is wider than that of the side of the second principal surface.

In the present invention, preferably, the first portion of the suspension lead has a third bent portion with an inside at the side of the second principal surface and the second portion of the suspension lead has a fourth bent portion with an inside at the side of the first principal surface.

According to the present invention, there is also provided a lead frame for use in semiconductor device provided with a lead having a plurality of bent portions, wherein a width of an inside of each bent portion is made wider than that of an outside.

In the present invention, the lead may comprise an external lead or a suspension lead.

According to the present invention, there is also provided a lead frame for use in semiconductor device, wherein a tie bar is provided for connecting a plurality of leads and, in each of the leads, one surface side is wider than the other surface side in a first portion positioned outwardly of the tie bar while the one surface side is narrower than the other surface side in a second portion positioned inwardly of the tie bar.

According to the present invention, by forming the width of the inside of each bent portion of the external lead wider than that of the outside, the following advantages can be obtained.

(1) A stable lead formation is possible in the external lead forming process because the bending fulcrum always lies at the side of the wider width.

(2) When the semiconductor device is mounted on the printed circuit board, since the solder fillet is sufficiently formed at the end portion of the external lead at the neighborhood of the outermost bent portion, the strength with which the printed circuit board and the external lead are interconnected is increased.

Further, by forming the width of the inside of each bent portion of the suspension lead wider than that of the outside, (3) since suspension lead formation for depressing the die pad portion can be stably performed during manufacturing the lead frame, and thereby the yield can be improved.

DESCRIPTION OF THE PREFERRED EMBODIMENTS

Next, several specific embodiments of the present invention are explained with reference to the accompanying drawings.

Figure 1A:
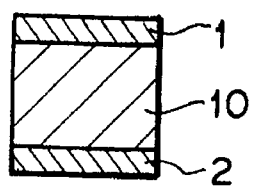
FIGS. 1A, and 1B are respectively cross-sectional views for explaining a first example of a conventional method of manufacturing the external lead.
Figure 1B:
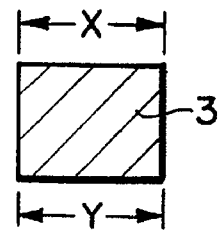
Figure 2A:
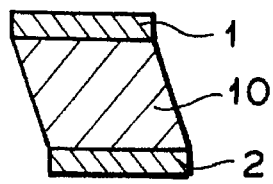
FIGS. 2A, and 2B are respectively cross-sectional views for explaining misalignment of photomask according to the first example of the conventional method.
Figure 2B:
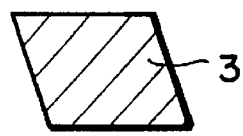
Figure 3:
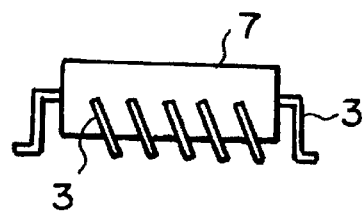
FIG. 3 is a side view of a semiconductor device for explaining the problem of the conventional external lead.
Figure 4A:
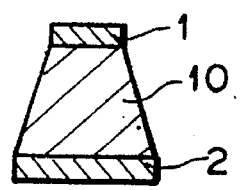
FIGS. 4A, and 4B are respectively cross-sectional views for explaining a second example of the conventional method of preparing the external lead.
Figure 4B:
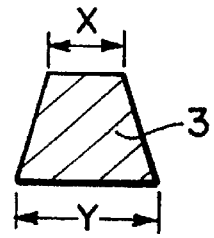
Figure 5A:
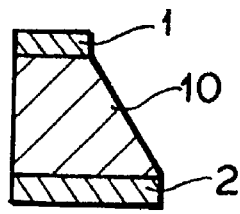
FIGS. 5A, and 5B are respectively cross-sectional views for explaining misalignment of photomask according to the second example of the conventional method.
Figure 5B:
Figure 6A:
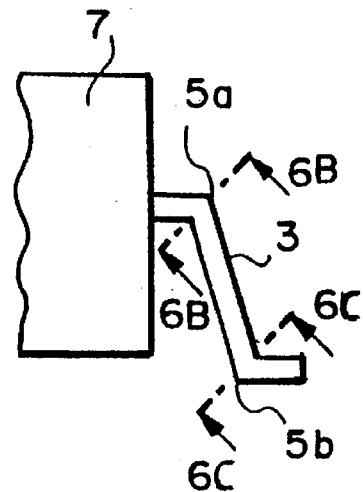
FIGS. 6A, 6B, and 6C are respectively a side view of a conventional gull wing type external lead, a cross-sectional view taken along line 6B—6B of FIG. 6A and a cross-sectional view taken along line 6C—6C of FIG. 6A.
Figure 6B:
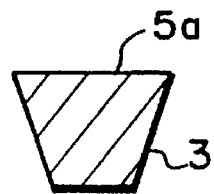
Figure 6C:
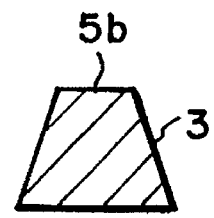
Figure 7A:
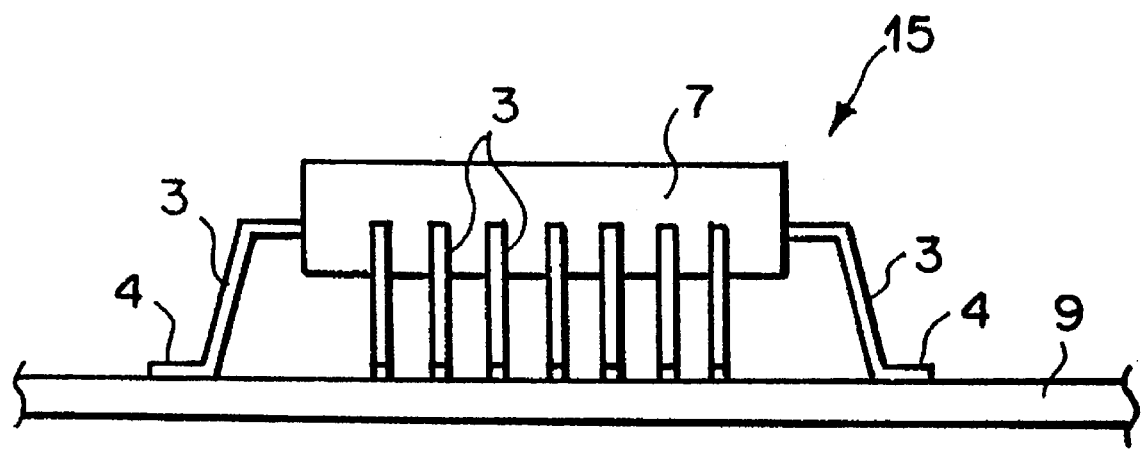
FIGS. 7A, and 7B are respectively a side view and a plan view of a semiconductor device according to the present invention.
Figure 7B:
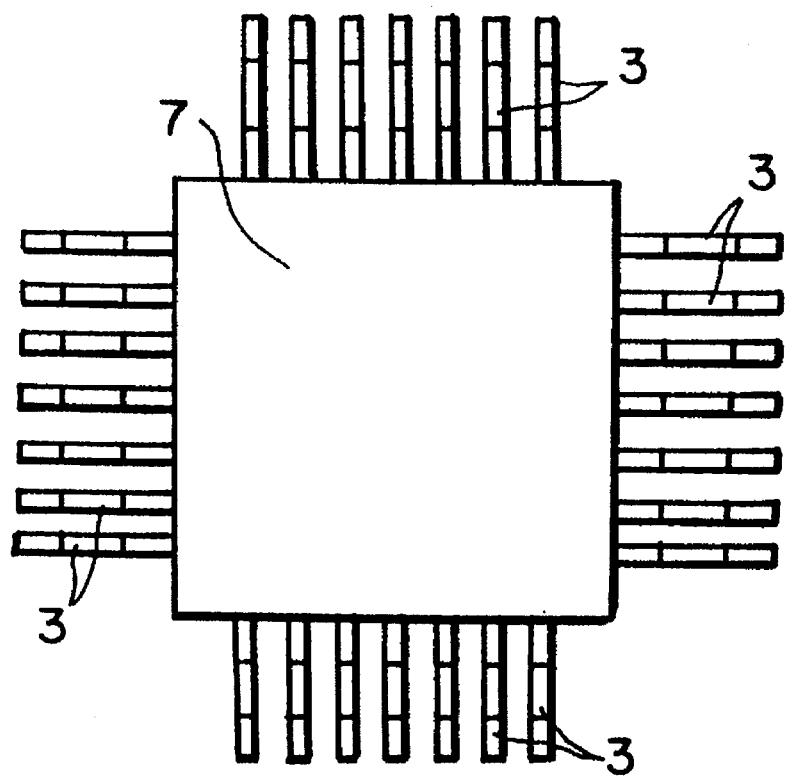
Figure 8A:
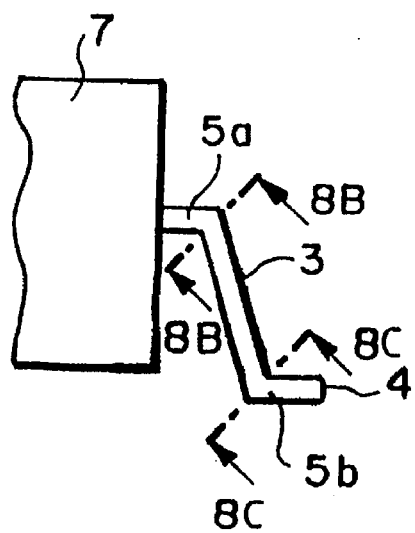
FIGS. 8A, 8B, and 8C are respectively a side view of a gull wing type external lead of the semiconductor device of FIGS. 7A, and 7B, a cross-sectional view taken along line 8B—8B of FIG. 8A and a cross-sectional view taken along line 8C—8C of FIG. 8A.
Figure 8B:
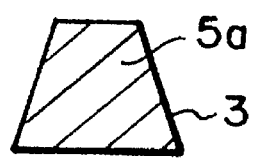
Figure 8C:
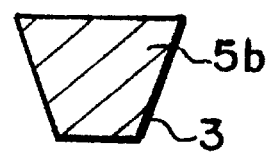
Figure 9:
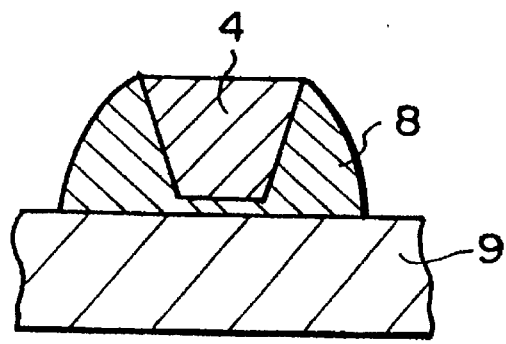
FIG. 9 is a cross-sectional view of a solder connecting portion of the external lead when the semiconductor device is mounted on the printed circuit board.

FIGS. 7A, and 7B are respectively a side view and a plan view of a semiconductor device according to an embodiment of the present invention. FIGS. 8A, 8B, and 8C are respectively a side view of a gull wing type external lead of the semiconductor device of FIGS. 7A, and 7B, a cross-sectional view taken along line 8B—8B of FIG. 8A and a cross-sectional view taken along line 8C—8C of FIG. 8A. FIG. 9 is a cross-sectional view of a solder connecting portion of the external lead when the semiconductor device is mounted on the printed circuit board.

As shown in FIGS. 7A and 7B, a semiconductor device 15 has a plurality of external leads 3. Each external lead 3 is formed in the form of a gull wing and the end portion 4 thereof is connected to a printed circuit board 9. Reference numeral 7 denotes a sealing resin. The semiconductor device according to this embodiment is called a QFP (quad flat package), and the external lead 3 is formed in the form of a gull wing. As shown in FIG. 8A, the external lead 3 has bent portions 5a, 5b at two points taken in the longitudinal direction. As shown in FIGS. 8B, and 8C, the cross section of the bent portions 5a, 5b is formed in the trapezoidal form, and the cross section of the bent portion 5a is formed into a trapezoidal form whose lower bottom is longer than the upper bottom as shown in FIG. 8B, while the cross section of the other bent portion 5b is formed into a trapezoidal form whose lower bottom is shorter than the upper bottom as shown in FIG. 8C.

Figure 12A:
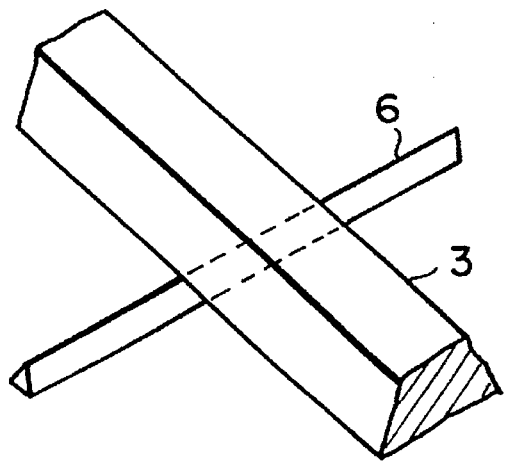
FIGS. 12A, and 12B are respectively perspective views of an external lead for explaining the difference between the present invention and the prior art.
Figure 12B:
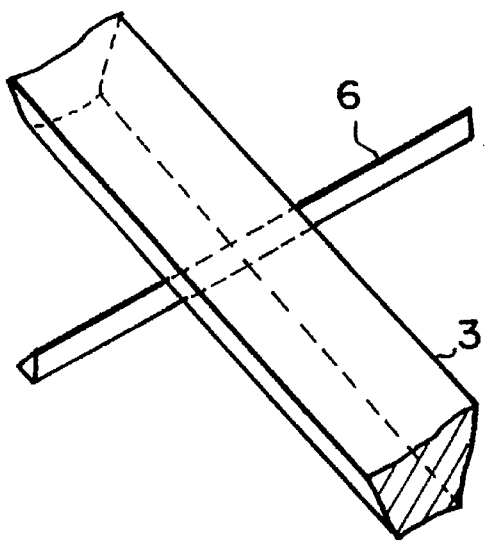

FIGS. 12A, and 12B are respectively perspective views of the external lead for explaining the difference between the embodiment of the present invention and the prior art. The cross section of the bent portion 5a is formed into the trapezoidal form of one direction, while the cross section of the bent portion 5b is formed into the trapezoidal form of the opposite direction, so that the width of the bended inside is formed wider than that of the outside. As shown in FIG. 12A, since fulcrum 6 is located at the side of wider width, a more stable lead formation is possible as compared with the case in which the fulcrum 6 is located at the side of narrower width as shown in FIG. 12B.

The trapezoidal cross section of the bent portion 5a continues from the inner end of the internal lead (not shown) in the sealed resin 7 shown in FIG. 8A up to the neighborhood of the midpoint between the bent portions 5a and 5b, and the cross section of the external lead 3 in the neighborhood of the midpoint is formed so that the oppositely directed trapezoids gradually approach each other continuously. Further, the trapezoidal cross section of the bent portion 5b continues from the neighborhood of the midpoint between the bent portions 5a, 5b up to the outer end portion 4 of the external lead 3.

When the semiconductor device of this embodiment is mounted onto the printed circuit board, since the width of the external lead 3 at the side connected to the printed circuit board is made narrower than that of the opposite side from the neighborhood of the midpoint between the bent portions 5a, 5b of the external lead 3 up to the external lead end portion 4, as shown in FIG. 9, the solder fillet 8 is sufficiently formed between the underside of the oblique sides of the external lead 3 and the printed circuit board 9, which allows the strength of soldering to be increased. As a concrete example of the lead frame, preferably, the trapezoidal cross section of the bent portions 5a, 5b is formed with 200 μm of the longer side and 160 μm of the shorter side when the width of the external lead is 200 μm and the maximum value of misalignment between the upper and lower surface photomasks is about 20 μm.

Figure 10:
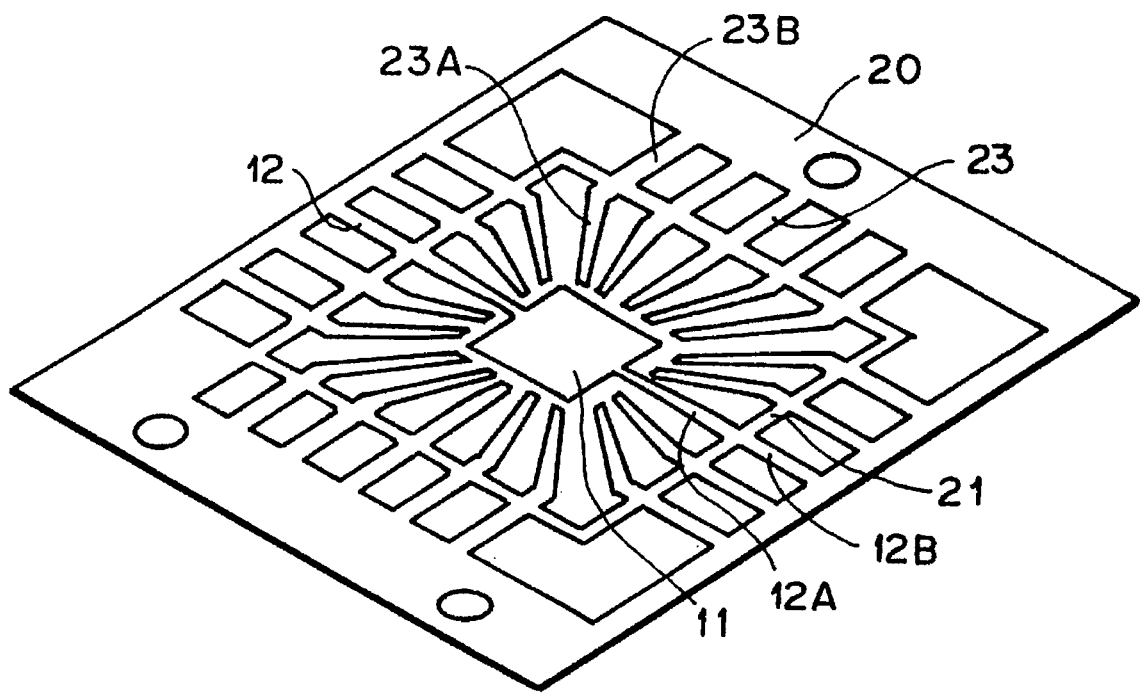
FIG. 10 is a perspective view of a lead frame according to the present invention.
Figure 11:
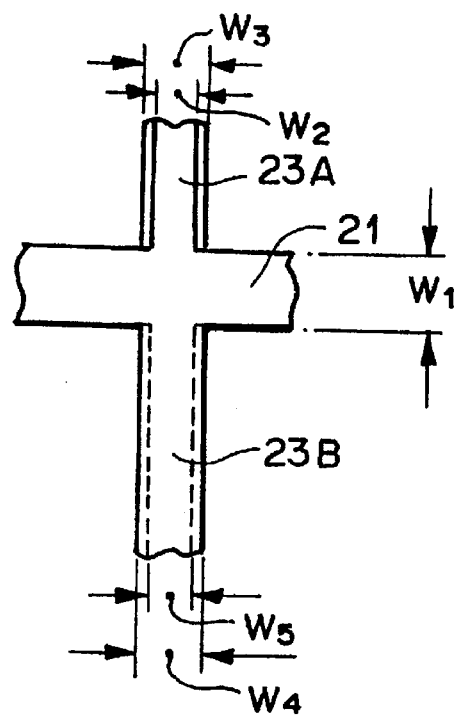
FIG. 11 is a partial, plan view of a lead frame of FIG. 10.

FIG. 10 is a perspective view of a lead frame according to the present invention and FIG. 11 is a partial, plan view of the lead frame of FIG. 10. As shown in FIGS. 10, and 11, the lead frame 20 has a die pad portion 11 to which a semiconductor integrated circuit chip is to be bonded. The die pad portion 11 is supported by a plurality of suspension leads 12. A plurality of leads 23 are positioned which are each to be used as the internal and external leads in the semiconductor device. The leads 23 and the suspension leads 12 are connected by a tie bar 21. Each lead 23 comprises a first portion 23B and a second portion 23A positioned outwardly and inwardly of the tie bar 21 respectively. Each suspension lead 12 comprises a first portion 12B and a second portion 12A positioned outwardly and inwardly of the tie bar 21 respectively. As shown in FIG. 11, the width $w_5$ of the lower surface side of the first portion 23B of the lead 23 is smaller than the width $w_4$ of the upper surface side, while the width $w_3$ of the lower surface side of the second portion 23A of the lead 23 is greater than the width $w_2$ of the upper surface side. For example, the widths $w_2$ and $w_5$ are 0.16 mm, the widths $w_3$ and $w_4$ are 0.2 mm and the widths $w_1$ of the tie bar 21 is 0.3 mm, when the thickness of the lead frame is 0.15 mm. Similarly, in the suspension lead 12, the lower surface side of the first portion 12B is made narrower than the upper surface side, while the lower surface side of the second portion 12A is wider than the upper surface side.

The lead frame 20 is used in manufacturing the semiconductor device as shown in FIGS. 7A, 7B, 8A, 8B, and 8C.

Figure 13A:
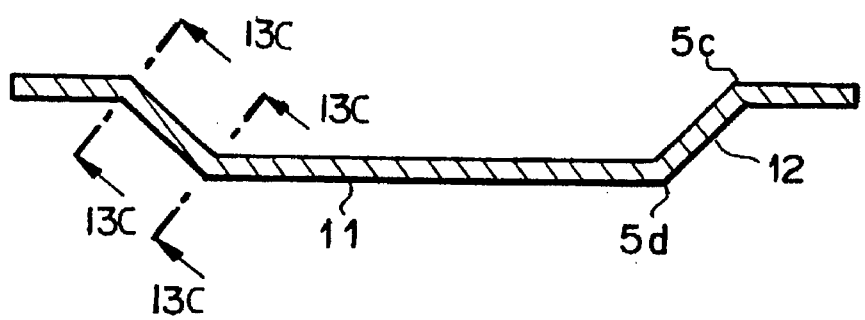
FIGS. 13A, 13B, and 13C are respectively a cross-sectional view of a lead frame according to the present invention, a cross-sectional view taken along line 13B—13B of FIG. 13A and a cross-sectional view taken along line 13C—13C of FIG. 13A.
Figure 13B:
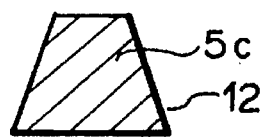
Figure 13C:
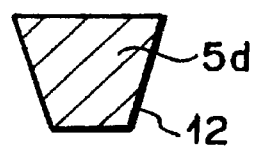

FIGS. 13A, 13B, and 13C are respectively a cross-sectional view of a lead frame according to the present invention, a cross-sectional view taken along line 13B—13B of FIG. 13A and a cross-sectional view taken along line 13C—13C of FIG. 13A. This lead frame is of a depressed die pad type. The suspension lead 12 has bent portions 5c, 5d, and the die pad portion 11 is depressed downwardly to form a concave configuration.

In the bent portions 5c, 5d, as shown in FIGS. 13B, and 13C, the width of the bended inside is made wider than that of the outside. By forming the suspension lead 12 in this manner, the suspension lead 12 can be stably formed based on a principle similar to the case of the above-mentioned embodiment, and manufacturing yield can be improved.

Figure 14A:
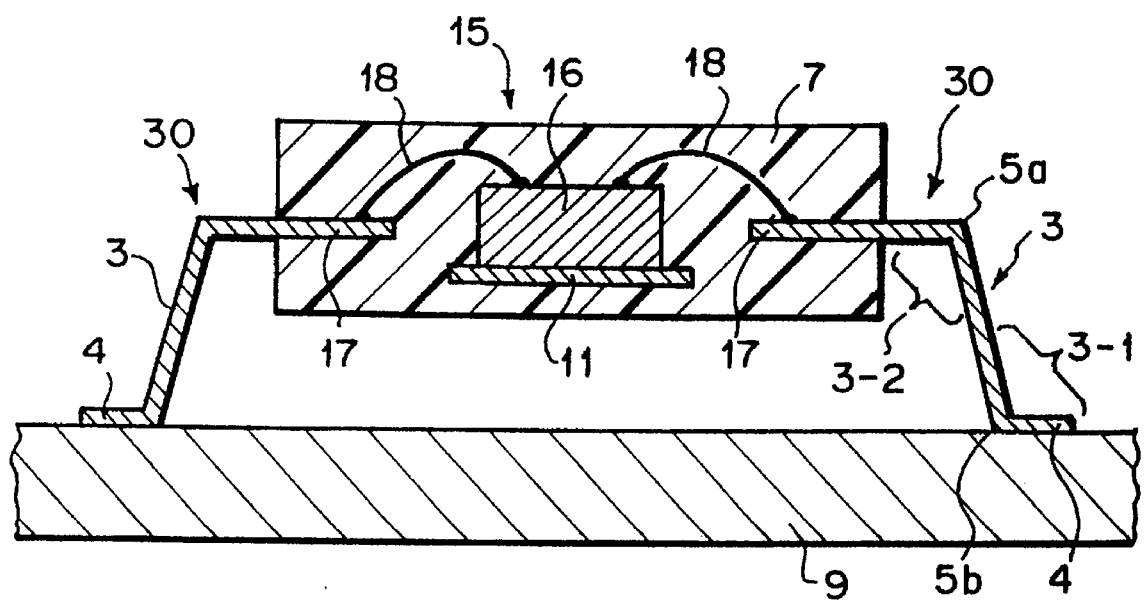
FIGS. 14A, 14B are respectively a cross-sectional view of a semiconductor device according to the present invention.
Figure 14B:
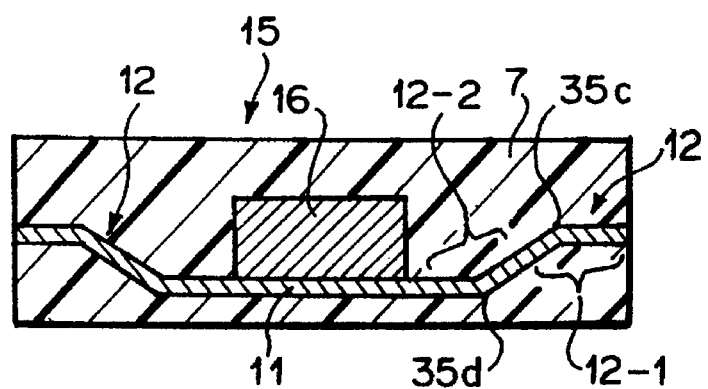

FIGS. 14A, and 14B are respectively cross-sectional views of a semiconductor device 15 according to another embodiment of the present invention.

A plurality of leads 30 each have a first principal surface, i.e. the upper surface, and a second principal surface, i.e. the lower surface. The lead 30 has an external lead portion 3 and an internal lead portion 17. The external lead portion 3 has the first principal surface and the second principal surface, and the internal lead portion 17 has the first principal surface and the second principal surface. The external lead portion 3 has a first portion 3-1 and a second portion 3-2. The second portion 3-2 connects the first portion 3-1 to the internal lead portion 17.

In the first portion 3-1, the width of a side of the first principal surface is wider than that of a side of the second principal surface, while, in the second portion 3-2, the width of the side of the second principal surface is wider than that of the side of the first principal surface. The first portion 3-1 has a first bent portion 5b with an inside at the side of the first principal surface and the second portion 3-2 has a second bent portion 5a with an inside at the side of the second principal surface. These are the same as the embodiment of FIGS. 7A, 7B, 8A, 8B, 8C, and 9.

A semiconductor chip 16 is loaded on the die pad portion 11. An electrode pad of the semiconductor chip 16 is electrically connected to the internal lead portion 17 by means of a thin metallic wire 18. The semiconductor chip 16, the internal lead portion 17 and the thin metallic wire 18 are sealed with resin 7 as a package.

An end portion 4 positioned externally of the first bent portion 5b is soldered to the printed circuit board 9 in the same manner as the above-mentioned embodiment, as shown in FIG. 9. That is, the solder fillet 8 is formed between the upper surface of the printed circuit board 9 and both lateral surfaces of the end portion 4 making an acute angle with the surface of the printed circuit board, so that the end portion 4 is connected to a printed circuit formed on the upper surface of the printed circuit board 9.

A suspension lead 12 has the first principal surface and the second principal surface and is connected to the die pad portion 11 to support it. The suspension lead 12 has a first portion 12-1 and a second portion 12-2. The second portion 12-2 connects the first portion 12-1 to the die pad portion 11.

In the first portion 12-1, a width of the side of the second principal surface is wider than that of the side of the first principal surface, while, in the second portion 12-2, a width of the side of the first principal surface is wider than that of the side of the second principal surface. The first portion 12-1 has a third bent portion 35c with an inside at the side of the second principal surface and the second portion 12-2 has a fourth bent portion 35d with an inside at the side of the first principal surface.

What is claimed is:

1. A semiconductor device comprising a plurality of leads, each of which leads has a first surface and a second surface extending in parallel to each other, wherein each of said leads has a first bent portion and a second bent portion, said first bent portion being formed by bending each lead to a side of said first surface and having a cross section in which a side of said first surface is longer than that of said second surface, said second bent portion being formed by bending the lead to a side of said second surface and having a cross section in which said side of said first surface is shorter than that of said second surface.

2. A semiconductor device as set forth in claim 1, wherein each of said leads comprises an external lead or a suspension lead.

3. A semiconductor device as set forth in claim 1, wherein an outer end portion of each said lead is soldered to a printed circuit board, said outer end portion having a trapezoidal cross section in which a side of one of the first and second surfaces adjacent to said printed circuit board is shorter than a side of the other of the first and second surfaces away from said printed circuit board.

4. A semiconductor device as set forth in claim 3, wherein said outer end portion of each said lead is soldered to said printed circuit board so as to form a solder fillet between a surface of said printed circuit board and two lateral surfaces of said outer end portion, and each of which lateral surfaces makes an acute angle with said surface of the printed circuit board.

5. A semiconductor device comprising:
a plurality of leads, said leads each having a first principal surface and a second principal surface, said leads each having an external lead portion and an internal lead portion each comprising said first principal surface and said second principal surface;
a semiconductor chip; and
a package for enfolding said semiconductor chip and said internal lead portion,
wherein said external lead portion has a first portion and a second portion, said second portion connecting said first portion to said internal lead portion and, in said first portion, a width of a side of said first principal surface is wider than that of a side of said second principal surface, while, in said second portion, a width of the side of said second principal surface is wider than that of the side of said first principal surface;
and also wherein in each said lead, the first portion of said external lead portion has a first bent portion formed by bending the external lead portion toward said side of said first principal surface and the second portion of said external lead portion has a second bent portion formed by bending said external lead portion toward said side of said second principal surface.

6. A semiconductor device according to claim 5, wherein said side of said first principal surface comprises an upper surface of said external lead portion, and said side of said second principal surface comprises a lower surface of said external lead portion.

7. A semiconductor device according to claim 5, wherein said first bent portion has an inner surface and an outer surface, said inner surface being wider than said outer surface, said second bent portion also having an inner surface and an outer surface, said inner surface of said second bent portion being wider than said outer surface of said second bent portion.

8. A semiconductor device comprising:
a plurality of leads, said leads each having a first principal surface and a second principal surface, said leads each having an external lead portion and an internal lead portion each comprising said first principal surface and said second principal surface;

a semiconductor chip; and a package for enfolding said semiconductor chip and said internal lead portion, wherein said external lead portion has a first portion and a second portion, said second portion connecting said first portion to said internal lead portion and, in said first portion, a width of a side of said first principal surface is wider than that of a side of said second principal surface, while, in said second portion, a width of the side of said second principal surface is wider than that of the side of said first principal surface; and also wherein in each said lead, an outer end portion of the external lead portion is soldered to a printed circuit board, said outer end portion having a trapezoidal cross section in which a side of one of the first and second principal surfaces adjacent to said printed circuit board is shorter than a side of the other of the first and second principal surfaces away from said printed circuit board.

9. A semiconductor device as set forth in claim 8, wherein said outer end portion of the external lead portion is soldered to said printed circuit board so as to form a solder fillet between a surface of said printed circuit board and both lateral surfaces of said outer end portion, and each of lateral surfaces makes an acute angle with said surface of the printed circuit board.

10. A semiconductor device comprising:

a plurality of leads, said leads each having a first principal surface and a second principal surface, said leads each having an external lead portion and an internal lead portion each comprising said first principal surface and said second principal surface;

a semiconductor chip; and a package for enfolding said semiconductor chip and said internal lead portion, wherein said external lead portion has a first portion and a second portion, said second portion connecting said first portion to said internal lead portion and, in said first portion, a width of a side of said first principal surface is wider than that of a side of said second principal surface, while, in said second portion, a width of the side of said second principal surface is wider than that of the side of said first principal surface; and also wherein said semiconductor device further comprises a die pad portion and a suspension lead, said suspension lead comprising said first principal surface and said second principal surface and being connected to said die pad portion to support said suspension lead, and also wherein said suspension lead includes a first portion and a second portion, said second portion of the suspension lead connecting said first portion of the suspension lead to said die pad portion and, in said first portion of the suspension lead, a width of the side of said second principal surface is wider than that of the side of said first principal surface, while, in said second portion of the suspension lead, a width of the side of said first principal surface is wider than that of the side of said second principal surface.

11. A semiconductor device as set forth in claim 10, wherein the first portion of said suspension lead includes a third bent portion formed by bending the suspension lead to a side of said second principal surface and the second portion of said suspension lead includes a fourth bent portion formed by bending the suspension lead to a side of said first principal surface.

\* \* \* \* \*